United States Patent [19]

Hancu

[11] Patent Number: 4,945,536

[45] Date of Patent: Jul. 31, 1990

[54] METHOD AND APPARATUS FOR TESTING DIGITAL SYSTEMS

[75] Inventor: Marius Hancu, Nepean, Canada

[73] Assignee: Northern Telecom Limited, Montreal, Canada

[21] Appl. No.: 242,244

[22] Filed: Sep. 9, 1988

[51] Int. Cl.$^5$ ............................................. G01R 31/28
[52] U.S. Cl. ................................... 371/22.3; 371/22.1
[58] Field of Search ............................. 371/22.3, 22.4; 324/73 R, 73 AT

[56] References Cited

U.S. PATENT DOCUMENTS

| | | | |
|---|---|---|---|
| 3,761,695 | 9/1973 | Eichelberger | 371/22.3 |
| 3,783,254 | 1/1974 | Eichelberger | 371/22.3 |
| 4,293,919 | 10/1981 | Dasgupta et al. | 364/716 |
| 4,357,703 | 11/1982 | Van Brunt | 371/22.5 |
| 4,513,418 | 4/1985 | Bardell, Jr. et al. | 371/22.3 |
| 4,553,090 | 11/1985 | Hatano et al. | 371/22.3 |
| 4,698,588 | 10/1987 | Hwang et al. | 324/73 R |
| 4,710,933 | 12/1987 | Powell et al. | 371/22.3 |
| 4,745,355 | 5/1988 | Eichelberger et al. | 324/73 R |
| 4,799,004 | 1/1989 | Mori | 324/73 R |
| 4,801,870 | 1/1989 | Eichelberger et al. | 324/73 R |

OTHER PUBLICATIONS

A Standard Boundary Scan Architecture, Version 1.0, Technical Subcommittee of the Joint Test Action Group (JTAG), Jun. 1987.
Konemann et al, IEEE Journal of Solid State Circuits, vol. SC-15, No. 3, pp. 315-319, Jun. 1980.
Krasniewski et al, 24th ACM/IEEE Design Automation Conference, Paper 24.4, pp. 407-415, Jun. 1987.
Stroud, 25th ACM/IEEE Design Automation Conference, Paper 3.1, pp. 3-8, Jun. 1988.

*Primary Examiner*—Charles E. Atkinson
*Attorney, Agent, or Firm*—C. W. Junkin

[57] ABSTRACT

In methods and apparatus for testing a digital system, system terminals used for coupling input signals into the system and output signals out of the system during normal operation of the system are connected in parallel to a single boundary register. The boundary register is operable to pass input signals and output signals transparently through the boundary register while accumulating together the input signals and the output signals. For testing purposes, the digital system and boundary register are run through a predetermined number of clock cycles while passing known input signals through the boundary register into the system. The known input signals and output signals provided by the digital system are concurrently accumulated within the boundary register to generate a test result pattern. In an alternative method and apparatus the boundary register is operable to generate input signals and to pass said input signals from the boundary register to selected system terminals while receiving output signals from selected system terminals and accumulating together the input signals and the output signals. The methods and apparatus are particularly useful for testing digital integrated circuits and systems comprising digital integrated circuits in their normal operating configuration and at their normal operating clock rates.

30 Claims, 9 Drawing Sheets

METHOD AND APPARATUS FOR TESTING DIGITAL SYSTEMS

FIELD OF THE INVENTION

This invention relates to methods and apparatus for testing digital systems such as digital integrated circuits or systems comprising a plurality of digital integrated circuits.

BACKGROUND OF THE INVENTION

In one known method for testing large digital systems such as digital integrated circuits, the elements of the system are partitioned into combinational networks and scannable memory elements. The scannable memory elements have a parallel or normal operation mode in which they are connected to the combinational networks of the system to provide memory functions required to perform the intended functions of the system. The scannable memory elements also have a serial or scan mode in which they are decoupled from the combinational logic and connected in series to form a shift register. Such partitioning and provision of scannable memory elements is known as Level Sensitive Scan Design (LSSD).

Digital systems employing LSSD are tested by configuring the scannable memory elements in serial mode, shifting a known test stimulus pattern into the shift register, reconfiguring the scannable memory elements into parallel mode, running the system clock through a single clock cycle, reconfiguring the scannable memory elements into serial mode, and shifting a test result pattern out of the shift register. The test result pattern is compared with a calculated test result pattern or with a test result pattern obtained from combinational logic known to be functioning properly to determine whether the combinational logic under test is functioning properly.

Typical LSSD techniques are described in U.S. Pat. No. 3,761,695 issued Sept. 25, 1973 and U.S. Pat. No. 3,783,254 issued Jan. 1, 1974, both in the name of E. B. Eichelberger, and in U.S. Pat. No. 4,293,919 issued Oct. 6, 1981 in the names of Dasgupta et al.

The LSSD technique has a number of disadvantages. Appropriate test stimulus patterns must be generated and corresponding test result patterns must be calculated or measured. This requires appropriate algorithms, computational facilities and skilled personnel. Memory must be provided for storage of test stimulus patterns and corresponding test result patterns until they are required for test application. Most importantly, the scannable memory elements and the combinational logic to be tested must be reconfigured after each test stimulus pattern in order to apply test stimulus patterns and to read out test result patterns, and the test stimulus patterns and test result patterns must be transmitted between external test equipment and the system under test via interconnecting cables which limit test clock operation to rates lower than the normal operating clock rate. Consequently, test conditions do not correspond exactly to normal operating conditions and faults unique to the normal operating conditions may go undetected. Moreover, the use of reconfigurable memory elements embedded throughout the digital system increases design complexity and cost, and compromises the performance of the resulting system.

In another technique, known as the boundary or peripheral scan technique, a digital system is partitioned according to its physical partitioning onto a number of integrated circuits. A scannable memory element is provided at each input and output pin of each integrated circuit. These memory elements have a parallel or normal operation mode in which they connect internal circuitry of the integrated circuits to the input and output pins to permit normal operation of the integrated circuit. The memory elements may or may not provide memory functions required in normal operation of the integrated circuits. The memory elements also have a serial or scan mode in which they are decoupled from the internal circuitry of the integrated circuits and connected in series to form shift registers.

The internal circuitry of integrated circuits having boundary scan architectures is tested by configuring the scannable memory elements in serial mode, shifting a known test stimulus pattern into memory elements which correspond to circuit inputs, reconfiguring the scannable memory elements into parallel mode, running the system clock through a single clock cycle, reconfiguring the scannable memory elements into serial mode, and shifting a test result pattern out of memory elements of the boundary register corresponding to circuit outputs. The test result pattern is compared with a calculated test result pattern or with a test result pattern obtained from an integrated circuit known to be functioning properly to determine whether the integrated circuit under test is functioning properly.

External circuitry interconnecting integrated circuits having boundary scan architectures is tested by configuring the scannable memory elements of the integrated circuits into serial mode, shifting a known test stimulus pattern into the scannable memory elements, reconfiguring the scannable memory elements into parallel mode to interconnect the outputs of the integrated circuits to the inputs of other integrated circuits via the external circuitry, clocking the memory elements to transfer bits of the test stimulus pattern over the external circuitry to the inputs of the other integrated circuit, reconfiguring the scannable memory elements into serial mode, and shifting a test result pattern out of the scannable memory elements. The test result patterns are compared with calculated test result patterns or test result patterns from integrated circuits having interconnections known to be good to determine whether the external circuitry is functioning properly.

Boundary scan architectures and techniques may be combined with LSSD architectures and techniques by providing scannable memory elements at inputs and outputs to the integrated circuit while also making scannable at least some of the memory elements which are internal to the integrated circuit.

Typical boundary scan architectures and techniques are described in "A Standard Boundary Scan Architecture", Version 1.0, Technical Subcommittee of the Joint Test Action Group (JTAG), June 1987.

The boundary scan technique overcomes some of the problems of the LSSD technique. In particular, the scannable memory elements are restricted to the periphery of the functional logic system to be tested, thereby reducing design complexity and cost. Moreover, the scannable memory elements are not generally needed for normal operation of the functional logic system and can be bypassed in the normal operation mode of the systems to avoid compromising performance of the system in its normal operation mode. The boundary scan technique also permits relatively straightforward testing of interconnections between digital systems.

However, the boundary scan technique does not overcome the need for generation of appropriate test stimulus patterns and calculation or measurement of corresponding test result patterns. Appropriate algorithms, computational facilities, skilled personnel, and memory for storage of test stimulus patterns and corresponding test result patterns are therefore required as in LSSD techniques. More importantly, the scannable memory elements must be reconfigured after each test stimulus pattern in order to apply test stimulus patterns and to read out test result patterns, and the test stimulus patterns and test result patterns must be transmitted between external test equipment and the system under test via interconnecting cables which limit test clock operation to rates lower than the normal operating clock rate as in LSSD techniques. Consequently, the test configuration does not correspond exactly to the normal operation configuration and certain subtle faults unique to the normal operation configuration may go undetected.

Built In Self Test (BIST) techniques overcome the need for external test stimulus pattern generation and storage by providing test stimulus pattern generators and test result pattern evaluators within the digital system to be tested. Because the test stimulus patterns and test result patterns need not be transmitted between external test equipment and the system under test via cables, the system can be tested at the normal operating clock rate. Consequently, faults which appear only at high clock rates will be detected.

For example, Konemann et al, IEEE Journal of Solid State Circuits, Vol. SC-15, No. 3, pp.315–319, June 1980 describes the use of linear feedback shift registers for generation of pseudo-random test stimulus patterns and for compression of test result patterns into test result signatures. The pseudo-random test patterns are applied to the circuitry under test, and test result patterns are extracted and accumulated into test result signatures. The test result signatures are compared to calculated signatures corresponding to circuitry known to function properly.

Combinations of BIST techniques with LSSD techniques are described in Krasniewski et al, 24th ACM/IEEE Design Automation Conference, Paper 24.4, pp.407–415, June 1987 and Stroud, 25th ACM/IEEE Design Automation Conference, Paper 3.1, pp.3–8, June 1988. Scannable memory elements of the circuit to be tested are connected to form a ring register, and each memory element includes an EXCLUSIVE OR gate which combines serial and parallel inputs to that memory element when the memory elements are configured in test mode. This arrangement provides test stimulus pattern generation and test result pattern compression within the shift register, thereby avoiding the need for test stimulus pattern generation and test result pattern compression external to the shift register as in more typical BIST architectures. Unfortunately, the scannable memory elements and the combinational logic to be tested must be reconfigured in order to apply test stimulus patterns and to read out test result patterns as in other LSSD techniques. As a result, test conditions do not correspond exactly to normal operating conditions and certain faults unique to the normal operating conditions may go undetected. Moreover, the use of reconfigurable memory elements embedded throughout the digital system increases design complexity and cost, and compromises the performance of the resulting system.

Another example of BIST techniques is described in U.S. Pat. No. 4,357,703 issued Nov. 2, 1982 in the name of Nicholas P. Van Brunt. An input shift register and an associated generator/accumulator provide a test stimulus pattern to the circuitry under test, and an output shift register and an associated generator/accumulator compresses the corresponding test result pattern into a test result signature. Interconnections between integrated circuits are tested by generating test patterns at the output generator/accumulator of one circuit and compressing corresponding test result patterns at the input generator/accumulator of downstream integrated circuits. However, the requirement for separate input and output shift registers and generator/accumulators complicates interconnection of the shift registers to the circuitry under test since the circuit inputs and outputs may typically be arranged in any order on the periphery of the integrated circuit.

SUMMARY OF THE INVENTION

This invention provides novel methods and apparatus for testing digital systems which combine advantages of the techniques described above while avoiding some of their disadvantages.

One aspect of this invention provides a method and apparatus for testing a digital system having a plurality of system terminals for coupling input signals into the system and output signals out of the system during normal operation of the system in which:

at least some of the system terminals are connected in parallel to boundary register means, the boundary register means being operable to pass input signals and output signals transparently through the boundary register means while accumulating together the input signals and the output signals;

the state of the digital system and the state of the boundary register means are initialized to predetermined states;

the digital system and boundary register means are run through a predetermined number of clock cycles while passing known input signals through the boundary register means into the system and the known input signals and output signals provided by the digital system are accumulated together within the boundary register means to generate a test result pattern; and the generated test result pattern is compared to a predetermined test result pattern.

The above method and apparatus permits testing of the digital system in its normal operation mode. Indeed, the above method and apparatus permit testing of the digital system while it is connected to other digital systems to receive inputs from and supply outputs to those other digital systems. Consequently, the digital system can be tested in its normal operating environment to provide test results which accurately reflect the operation of the system under real working conditions. Moreover, the digital system need not be reconfigured for testing or for normal operation.

The single boundary register means of the above method and apparatus is connected to input and output terminals of the digital system in any order. There is no need to separate the input and output terminals and connect them to separate input and output registers. This simplifies physical layout of the digital system and boundary register means, and simplifies interconnection of the digital system with the boundary register means.

Another aspect of the invention provides a method and apparatus for testing a digital system having a plurality of system terminals for coupling input signals into the system and output signals out of the system during normal operation of the system in which:

at least some of the system terminals are connected in parallel to boundary register means, the boundary register means being operable to generate input signals and to pass said input signals from the boundary register means to selected system terminals while receiving output signals from selected system terminals and accumulating together the input signals and the output signals;

the state of the digital system and the state of the boundary register means are initialized to predetermined states;

the digital system and boundary register means are run through a predetermined number of clock cycles to generate input signals and to pass the input signals from the boundary register means to selected system terminals while receiving output signals from selected system terminals and accumulating together within the boundary register means the input signals and output signals to generate a test result pattern; and the generated test result pattern is compared to a predetermined test result pattern.

The above method and apparatus provide test generation and accumulation in a single boundary register means avoiding the need for separate test generators and accumulators. The single boundary register means of the above method and apparatus is connected to input and output terminals of the digital system in any order simplifying physical layout of the digital system and boundary register means and interconnection of the digital system and the boundary register means.

The above method and apparatus permit testing of the digital system in isolation, testing of interconnections between digital systems and combined testing of the digital system and its connections to other digital systems.

The digital system and the associated boundary register means may be implemented as a single integrated circuit. The remaining elements of the test apparatus may also be implemented as parts of the same integrated circuit.

A plurality of digital subsystems may be interconnected via boundary registers surrounding individual subsystems to provide a partitioned system having integral self-test functions. The system may implemented as a single integrated circuit or may be partitioned on a subsystem basis into separate integrated circuits.

Other aspects of the invention include the novel boundary registers of the test apparatus described above and novel unidirectional and bidirectional boundary register cells which may be used to implement such boundary registers.

BRIEF DESCRIPTION OF THE DRAWINGS

Embodiments of the invention are described below by way of example only with reference to the accompanying drawings in which.

DETAILED DESCRIPTION OF EMBODIMENTS

Figure 1:
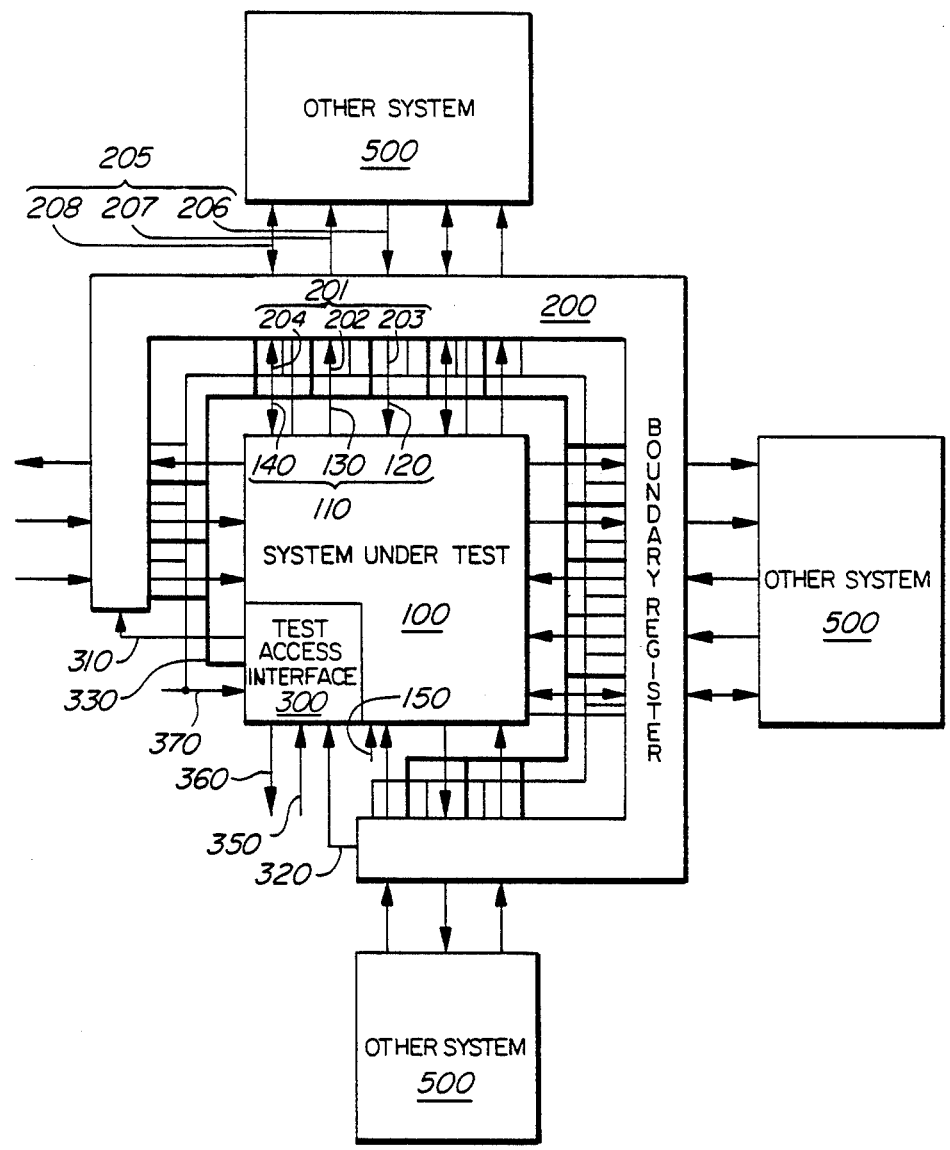
FIG. 1 is a schematic diagram of test apparatus according to an embodiment of the invention.

FIG. 1 illustrates test apparatus for testing a digital system 100 having a plurality of system terminals 110 for coupling input signals into the system 100 and output signals out of the system 100 during normal operation of the system 100. The system terminals 110 include input terminals 120, output terminals 130 and bidirectional terminals 140. The system 100 also has a system clock terminal 150.

The test apparatus comprises boundary register means in the form of a boundary register 200 for connection in parallel to each of the system terminals 110. The boundary register 200 has a first plurality of terminals 201 for connection to corresponding terminals 110 of the system 100 under test and a second plurality of terminals 205 for connection to corresponding terminals of external systems 500. The terminals 201, 205 include input terminals 202, 206, output terminals 203, 207, and bidirectional terminals 204, 208. The external systems 500 may be systems normally connected to the system 100 for normal operation of the system 100, or external test systems connected to the system 100 via the boundary register 200 only to provide inputs and receive outputs during testing.

The test apparatus further comprises a test access interface 300 which is connected to the boundary register 200 by means of a serial data input line 310 for coupling serial data from the test access interface 300 to the boundary register 200 and by means of a serial data output line 320 for coupling serial data from the boundary register 200 to the test access interface 300. The test access interface 300 is also connected to the boundary register 200 by means of a mode control bus 330 for coupling mode control signals to the boundary register 200.

The test access interface 300 has a serial data input terminal 350 for receiving serial data and control signals from external test equipment, and a serial data output terminal 360 for sending serial data to external test equipment, and a test clock terminal 370 for receiving timing information from external test equipment.

In use of the test apparatus in one test mode, the test access interface 300 applies a mode control signal on the mode control bus 330 to configure the boundary register 200 in scan mode and connects the serial data input terminal 350 to the serial data input line 310. The boundary register 200, which is operable as a shift register when configured in scan mode, is clocked to shift a predetermined seed pattern into the boundary register 200 to initialize the state of the boundary register 200. The test access interface applies a reset condition or other initialization sequence to the system 100 under test and to any external systems 500 connected to the system 100 via the boundary register 200.

The test access interface applies another mode control signal on the mode control bus 330 to reconfigure the boundary register 200 for mission mode testing and connects the register serial data input line 310 to the register serial data output line 320. When configured for mission mode testing, the boundary register 200 is operable to pass input signals and output signals transparently through the boundary register 200 while accumulating together the input signals and the output signals within the boundary register 200. The system 100 under test and the boundary register 200 are run through a predetermined number of clock cycles while passing known input signals through the boundary register 200 into the system 100 under test and accumulating together within the boundary register 200 the known input signals and output signals provided by the system 100 under test to generate a test result pattern.

The known input signals may be provided by external test equipment or may be provided by other digital systems connected to the system 100 under test via the boundary register 200. In the latter case, the system 100 is tested in its normal operating environment and faults unique to operation of the system 100 in its normal operating environment may be detected.

The test access interface 300 applies another mode control signal to the mode control bus 330 to reconfigure the boundary register 200 in scan mode and connects the serial data output line 320 to the serial data output terminal 360. The boundary register 200 is clocked to shift the test result pattern out of the boundary register 200 for comparison with a predetermined test result pattern obtained from or calculated for a properly functioning system.

In use of the test apparatus in other test modes, the states of the boundary register 200 and the system 100 under test are initialized as described above but different mode control signals are applied to the mode control bus 330 to render the boundary register 200 operable to generate input signals and to pass those input signals from the boundary register 200 to selected system terminals 110 while receiving output signals from selected system terminals 110 and accumulating together the input signals and the output signals within the boundary register 200. In these other test modes, the test access interface 300 connects the serial data input line 310 to the serial data output line 320 to configure the boundary register 200 as a ring register.

Inputs to the boundary register 200 from external test equipment or from other digital systems 500 connected to the system 100 under test via the boundary register 200 may or may not be used in the generation of input signals by the boundary register 200 as will be described in greater detail below with reference to a particular implementation of the boundary register 200. In an "internal test mode" described in greater detail below, inputs from other digital systems 500 are not used to generate test inputs to the system 100 under test, and the system 100 is tested in isolation. In an "external test mode" described in greater detail below, inputs from other digital systems 500 and outputs to other digital systems 500 are used to generate test inputs to the system 100 under test, so the system 100 and the external systems 500 are tested together along with the interconnections between the systems 100, 500.

In the particular implementation of the boundary register 200 described below, the boundary register 200 is operable to pass the output signals received from selected terminals of the system 100 under test transparently through the boundary register 200 while accumulating those output signals together with the input signals generated by the boundary register 200. This feature is particularly useful for testing two or more interconnected digital systems 100, 500 as will be described in greater detail below.

Figure 2:
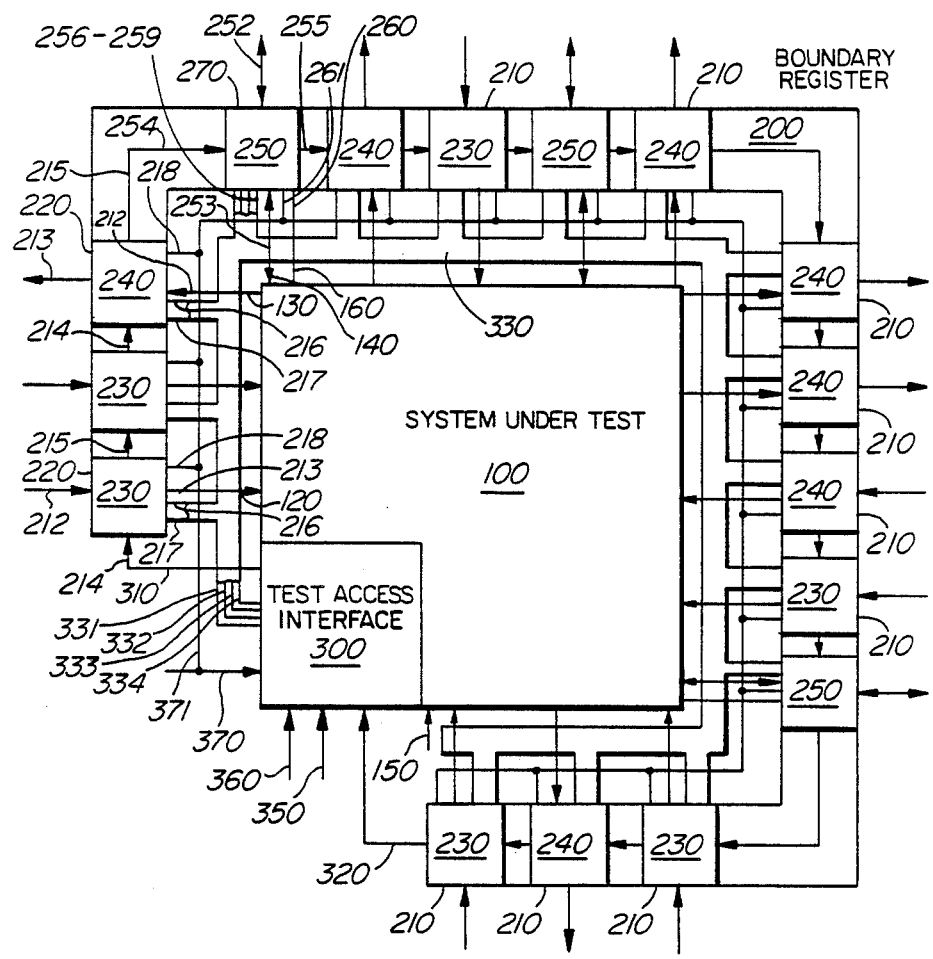
FIG. 2 is a schematic diagram of a boundary register of the test apparatus of FIG. 1.

Referring to FIG. 2, one implementation of the boundary register 200 comprises a plurality of unidirectional boundary register cells 210 each having a parallel input terminal 212, a parallel output terminal 213, a serial input terminal 214, a serial output terminal 215, a pair of mode control terminals 216, 217 and a test clock terminal 218. The terminals 212-218 are connected to signal gating and accumulation circuitry 220 described in greater detail below.

Some of the unidirectional boundary register cells 210 have their respective parallel output terminals 213 connected to respective input terminals 120 of the system 100 under test for coupling inputs to the system 100 and their mode control terminals 216, 217 connected to selected lines 331, 332 of the mode control bus 330. These cells pass signals from the boundary register 200 into the system 100 under test and are referred to as input cells 230 in the description which follows. Others of the unidirectional boundary register cells 210 have their respective parallel input terminals 212 connected to respective output terminals 120 of the system 100 under test for receiving outputs from the system 100 and their mode control terminals 216, 217 connected to other selected lines 333, 334 of the mode control bus 330. These cells receive outputs from the system 100 under test and are referred to as output cells 240 in the description which follows.

In the implementation of FIG. 2, the boundary register 200 further comprises a plurality of bidirectional boundary register cells 250, each having first and second bidirectional or parallel input/output terminals 252, 253, a serial input terminal 254, a serial output terminal 255, four mode control terminals 256, 257, 258, 259, a direction control terminal 260 and a test clock terminal 261. The terminals 252-261 are connected to signal gating and accumulation circuitry 270 described in greater detail below.

Each bidirectional cell 250 has one of its parallel input/output terminals 252, 253 connected to a respective bidirectional terminal 140 of the system 100 under test and its direction control terminal 260 connected to a terminal 160 which carries a signal which controls the direction of the respective bidirectional terminal 140. The four mode control terminals 256-259 of each bidirectional cell 250 are connected to the four lines 331-334 of the mode control bus 330. The bidirectional cells 250 are able to pass inputs into the system 100 and receive outputs from the system 100 according to the logical value applied to the direction control terminal 260.

The input cells 230, output cells 240 and bidirectional cells 250 are connected in series, serial output terminals 215, 255 to serial input terminals 214, 254 to comprise a chain of cells. The cells may be connected in any serial order and, for a given system 100 under test, are connected in an order which corresponds to the arrangement of input terminals 120, output terminals 130 and bidirectional terminals 140 so as to simplify interconnection of the system 100 with the boundary register 200.

Figure 3:
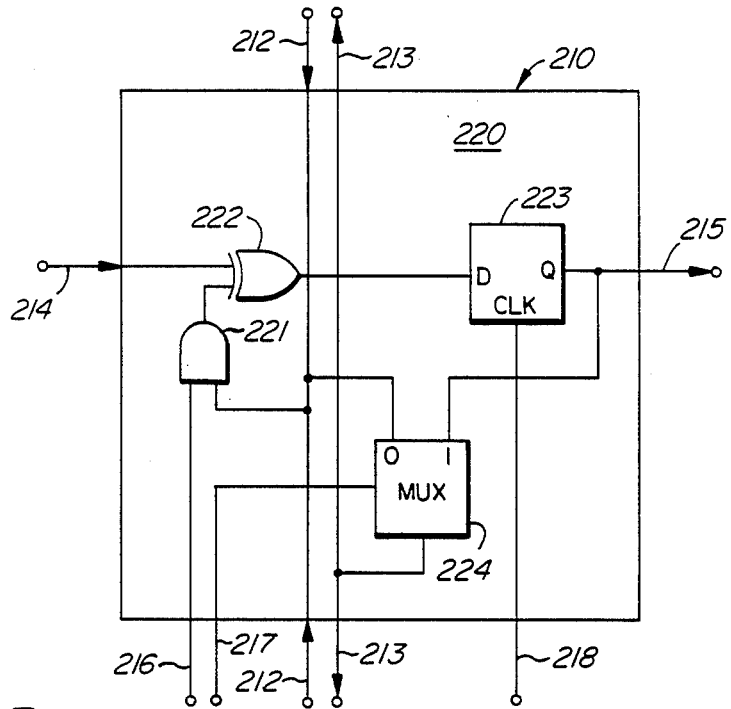
FIG. 3 is a schematic diagram of one implementation of a unidirectional cell of the boundary register of FIG. 2.

Referring to FIG. 3, in one implementation of the unidirectional cells 210, the mode control terminals 216, 217 comprise an input select terminal 216 and an output select terminal 217. In this implementation, the signal gating and accumulation circuitry 220 comprises an AND gate 221 having a first input connected to the input select terminal 216 and a second input connected to the parallel input terminal 212; an EXCLUSIVE OR gate 222 having a first input connected to the output of the AND gate 221 and a second input connected to the serial input terminal 214; a flip flop 223 having a data input connected to the output of the EXCLUSIVE OR gate 222, a clock input connected to the clock terminal 218 and a data output connected to the serial output terminal 215; and a multiplexer 224 having a first data input connected to the data output of the flip flop 223, a second data input connected to the parallel input terminal 212, a select input connected to the output select terminal 217 and a data output connected to the parallel output terminal 213.

The unidirectional cell 210 shown in FIG. 3 has four distinct modes of operation depending on the value of signals applied to the input and output select terminals 216, 217. When a logical zero is applied to both the input select terminal 216 and the output select terminal 217 the unidirectional cell 210 transfers one bit from the parallel input terminal 212 to the parallel output terminal 213 and transfers when clocked another bit from the serial input terminal 214 to the serial output terminal 215. When a logical one is applied to the input select terminal 216 and a logical zero is applied to the output select terminal 217 the unidirectional cell 210 transfers a bit from the parallel input terminal 212 to the parallel output terminal 213 while transferring when clocked the modulo 2 sum of bits on the parallel input terminal 212 and the serial input terminal 214 to the serial output terminal 215. When a logical zero is applied to the input select terminal 216 and a logical one is applied to the output select terminal 217, the unidirectional cell 210 transfers when clocked a bit from the serial input terminal 214 to both the serial output terminal 215 and the parallel output terminal 213. When a logical one is applied to both the input select terminal 216 and the output select terminal 217 the unidirectional cell 210 transfers the modulo 2 sum of bits on the parallel input terminal 212 and the serial input terminal 214 to both the parallel output terminal 213 and the serial output terminal 215.

Figure 4:
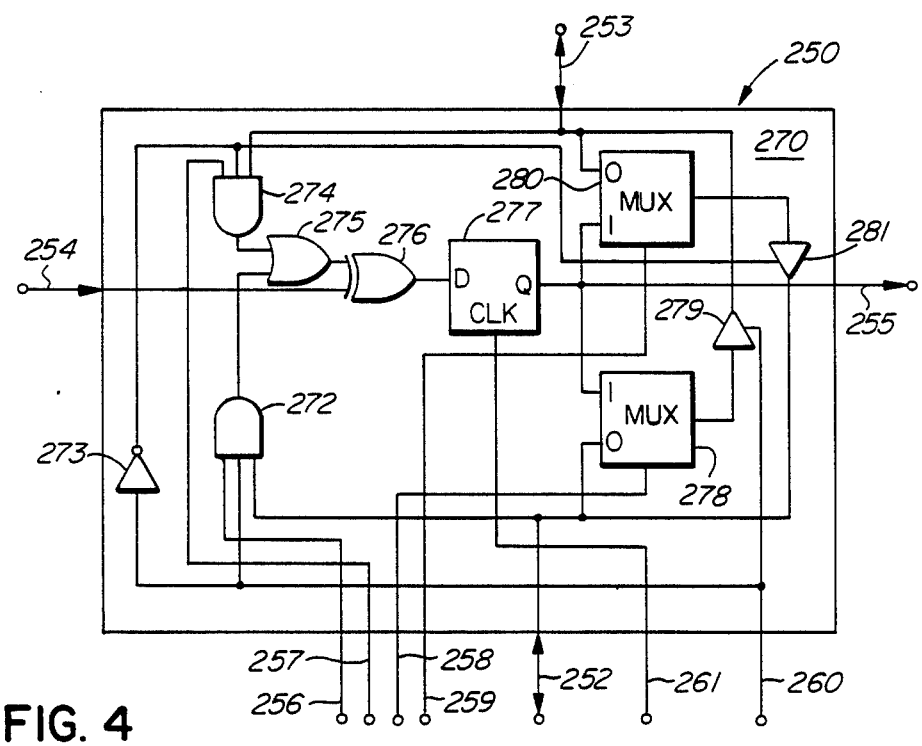
FIG. 4 is a schematic diagram of one implementation of a bidirectional cell of the boundary register of FIG. 2.

Referring to FIG. 4, in one implementation of the bidirectional cells 250, the mode control terminals 256-259 comprise first and second input select terminals 256, 257, and first and second output select terminals 258, 259. In this implementation, the signal gating and accumulation circuitry 270 comprises a first AND gate 272 having a first input connected to the first input select terminal 256, a second input connected to the first parallel input/output terminal 252, and a third input connected to the direction select terminal 260; an invertor 273 having an input connected to the direction select terminal 260; a second AND gate 274 having a first input connected to the second input select terminal 257, a second input connected to the second parallel input/output terminal 253 and a third input connected to the output of the invertor 273; an OR gate 275 having a first input connected to the output of the first AND gate 272 and a second input connected to the output of the second AND gate 274; an EXCLUSIVE OR gate 276 having a first input connected to the output of the OR gate 275 and a second input connected to the serial input terminal 254; a flip flop 277 having a data input connected to the output of the EXCLUSIVE OR gate 276, a clock input connected to the clock terminal 261 and a data output connected to the serial output terminal 255; a first multiplexer 278 having a first data input connected to the data output of the flip flop 277, a second data input connected to the first parallel input/output terminal 252 and a select input connected to the first output select terminal 258; a first tri-state buffer 279 having an enable input connected to the direction select terminal 260, a data input connected to data output of the first multiplexer 278 and a data output connected to the second parallel input/output terminal 253; a second multiplexer 280 having a first data input connected to the data output of the flip flop 277, a second data input connected to the second parallel input/output terminal 253 and a select input connected to the second output select terminal 259; a second tri-state buffer 281 having an enable input connected to the output of the invertor 273, a data input connected to data output of the second multiplexer 280 and a data output connected to the first parallel input/output terminal 252.

The bidirectional cell 250 has one set of four modes in which the first input select terminal 256 corresponds to the input select terminal 216 of the unidirectional cell 210, the first output select terminal 258 corresponds to output select terminal 217 of the unidirectional cell 210, the first parallel input/output terminal 252 corresponds to the parallel input terminal 212 of the unidirectional cell 210 and the second parallel input/output terminal 253 corresponds to the parallel output terminal 213 of the unidirectional cell 210, and another set of four modes in which the second input select terminal 257 corresponds to the input select terminal 216 of the unidirectional cell 210, the second output select terminal 259 corresponds to the output select terminal 217 of the unidirectional cell 210, the second parallel input/output terminal 253 corresponds to the parallel input terminal 212 of the unidirectional cell 210 and the first parallel input/output terminal 252 corresponds to the parallel output terminal 213 of the unidirectional cell 210. The first set of modes is selected by applying a logical zero to the direction select terminal 260 and applying mode control bits to the first input and output select terminals 256, 258 as described above for the input and output select terminals 216, 217 of the unidirectional cells 210. The second set of modes is selected by applying a logical one to the direction select terminal 260 and applying mode control bits to the second input and output select terminals 257, 259 as described above for the input and output select terminals 216, 217 of the unidirectional cells 210.

Figure 5:
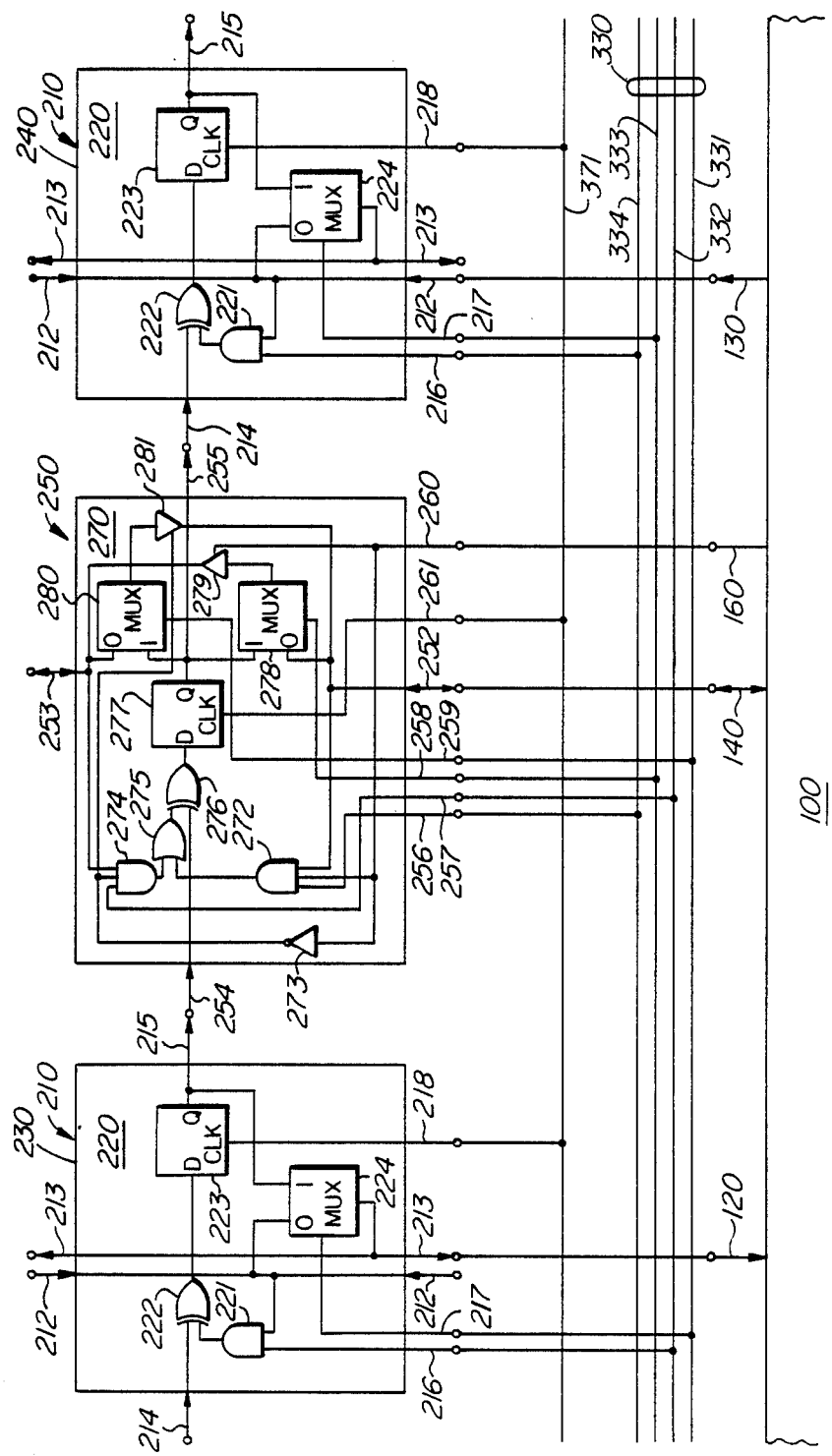
FIG. 5 is a schematic diagram of the boundary register cells of FIGS. 3 and 4 interconnected to form part of a boundary register.

The unidirectional and bidirectional cells 210, 250 are connected as shown in FIG. 5 to construct part of the boundary register 200.

A unidirectional cell 210 is configured as an input cell 230 by connecting its parallel input terminal 212 to external test equipment or to another digital system 500, its parallel output terminal 213 to an input terminal 120 of the system 100 to be tested, its serial input terminal 214 to the serial output terminal of a preceding cell (not shown), and its serial output terminal 215 to the serial input terminal 254 of a succeeding cell 250. The input and output select terminals 216, 217 are connected to leads 332, 331 respectively of the mode control bus 330, and the test clock terminal 218 is connected to a test clock line 371.

Another unidirectional cell 210 is configured as an output cell 240 by connecting its parallel input terminal 212 to an output terminal 130 of the system 100 to be tested, its parallel output terminal 213 to external test equipment or another digital system 500, its serial input terminal 214 to the serial output terminal 255 of a preceding cell 250 and its serial output terminal 215 to the serial input terminal of a succeeding cell (not shown). The input and output select terminals 216, 217 are connected to leads 334, 333 respectively of the mode control bus 330, and the test clock terminal 218 is connected to the test clock line 371.

A bidirectional cell 250 is connected between the input cell 230 and the output cell 240 by connecting one of its parallel input/output terminals 252 to a bidirectional terminal 140 of the system 100 under test and the other parallel input/output terminal 253 to external test equipment or another digital system, connecting its serial input terminal 254 to the serial output terminal 215 of the preceding cell 230 and connecting its serial output terminal 255 to the serial input terminal 214 of the succeeding cell 240. The first and second input select terminals 256, 257 and the first and second output select terminals 258, 259 are connected to leads 331-334 respectively of the mode control bus 330, and the test clock input terminal 261 is connected to the test clock line 371. The direction control terminal is connected to a terminal 160 of the system 100 under test which controls the direction of the bidirectional terminal 140.

The input cells 230, output cells 240 and bidirectional cells 250 may be arranged in any order to form the boundary register 200 and are generally arranged in an order corresponding to the physical arrangement of input, output and bidirection terminals 120, 130, 140 of the system 100 to be tested so as to facilitate interconnection of the boundary register 200 and the system 100.

Figure 6:
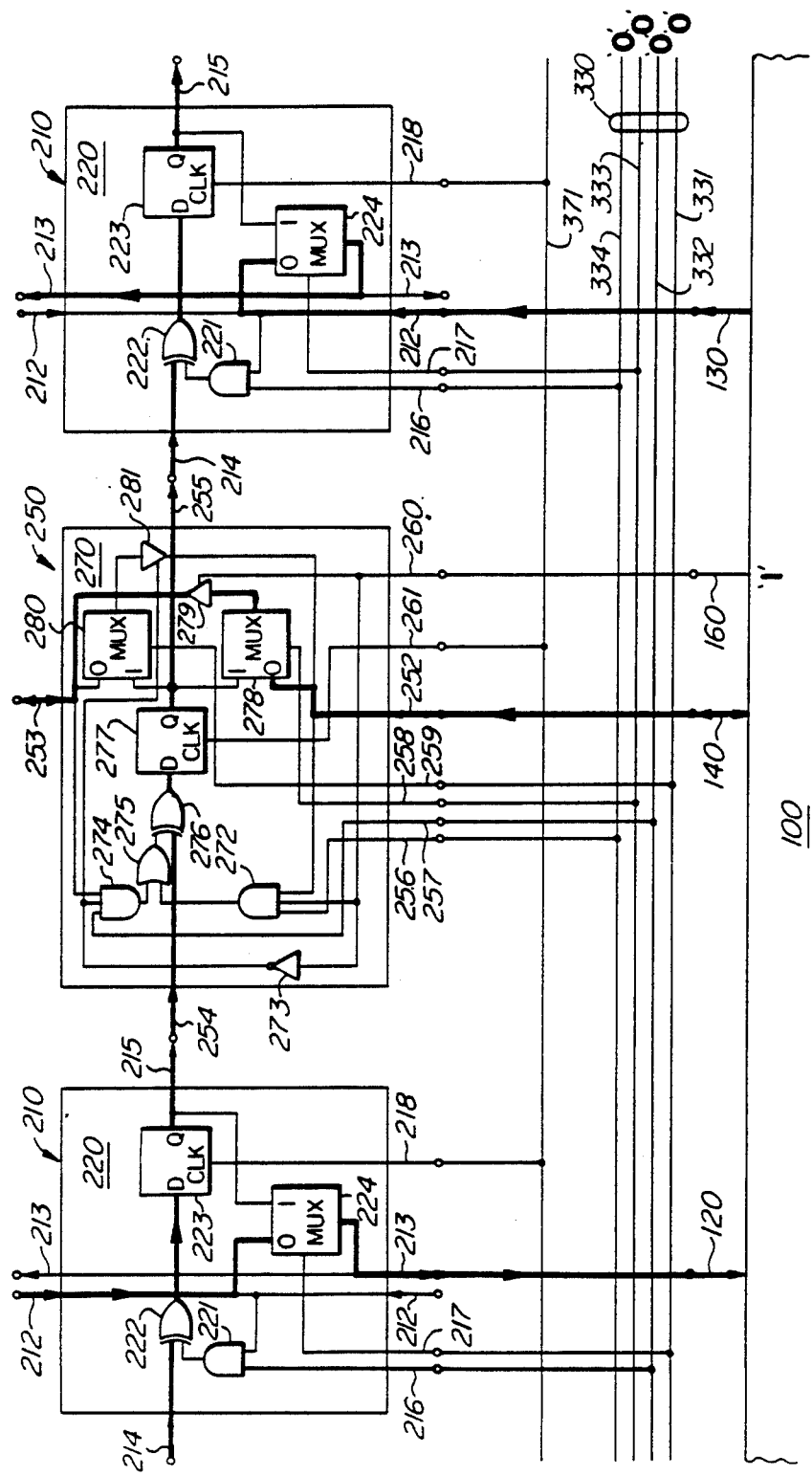
FIG. 6 is a schematic diagram of the boundary register part of FIG. 5 configured for shifting test patterns into and out of the boundary register.

The operating mode of the boundary register 200 is controlled by signals applied to the mode control bus 330. FIG. 6 illustrates the signal paths for the shift mode of the boundary register 200 which is obtained by applying logical zeros to each lead 331-334 of the mode control bus. In the shift mode the boundary register 200 shifts bits serially without alteration. This mode is useful for shifting test stimulus or seed patterns into the boundary register 200 and for shifting test result patterns out of the boundary register 200. The boundary register 200 also passes parallel data transparently in this mode of operation. Consequently this mode can be used during normal operation of the system 100 in conjunction with other digital systems 500 connected to the system 100 via the boundary register 200. The bidirectional cell 250 is shown operating as an output cell since a logical one is applied to the direction select terminal 260.

Figure 7:
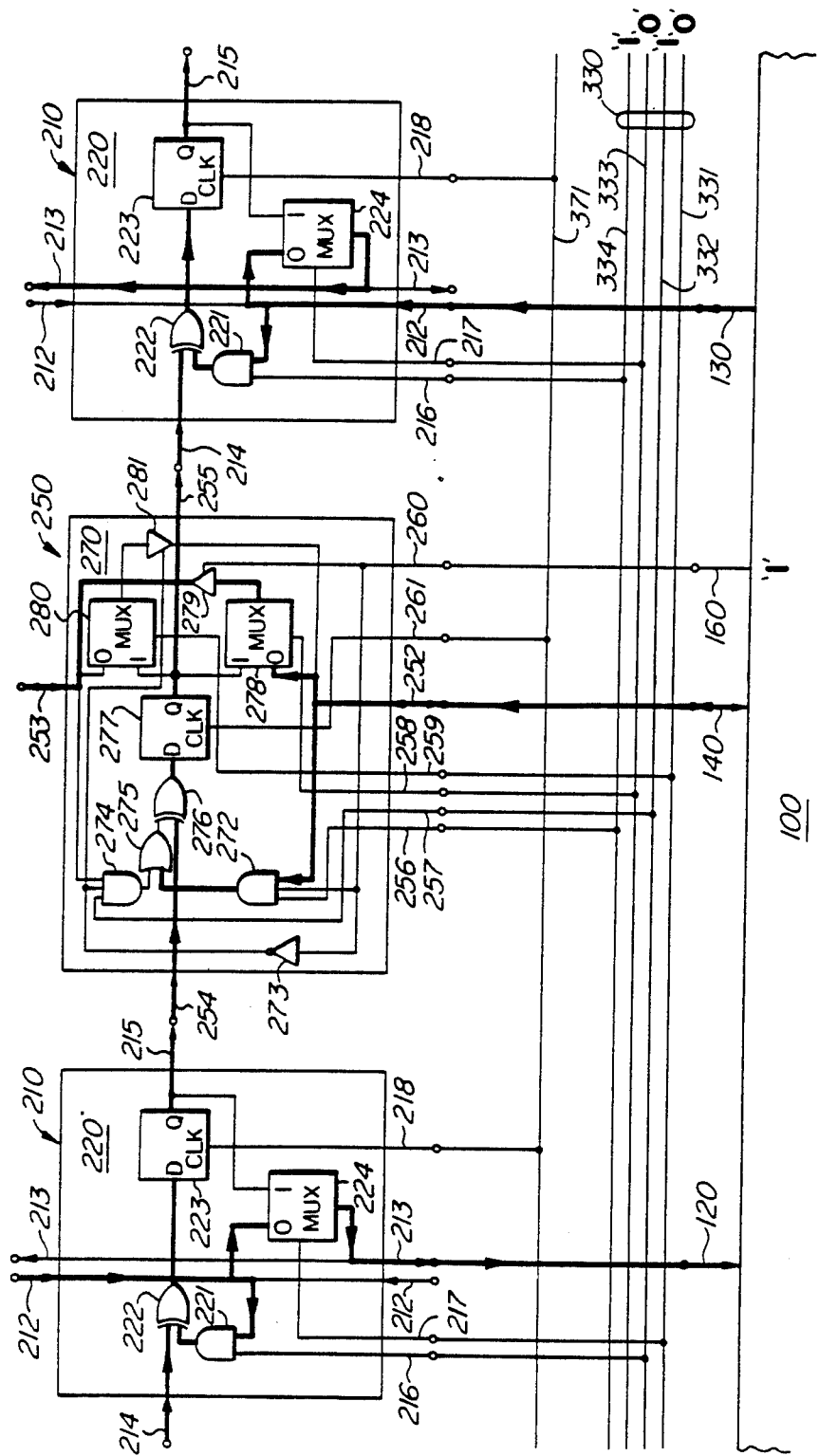
FIG. 7 is a schematic diagram of the boundary register part of FIG. 5 configured for mission mode testing.

FIG. 7 illustrates the signal paths for the mission mode of the boundary register 200 which is obtained by applying logical zeros to leads 331, 333 and logical ones to leads 332, 334 of the mode control bus, and connecting the serial output line 320 to the serial input line 310 at the test access interface 300 to configure the boundary register 200 as a ring register. In the mission mode each cell 230, 240, 250 of the boundary register passes parallel data transparently while applying the modulo 2 sum of the serial input data and the parallel input data to the serial output terminal 215, 255. Thus, the boundary register 200 passes inputs and outputs transparently into and out of the system 100 under test while accumulating the inputs and outputs in a running checksum which can be compared to a known checksum to determine whether the system 100 under test is functioning properly. Because the boundary register 200 passes inputs and outputs transparently in this mode, the system 100 can be connected to external systems 500 via the boundary register 200 for normal operation, and its normal operation can be monitored without perturbation.

Figure 8:
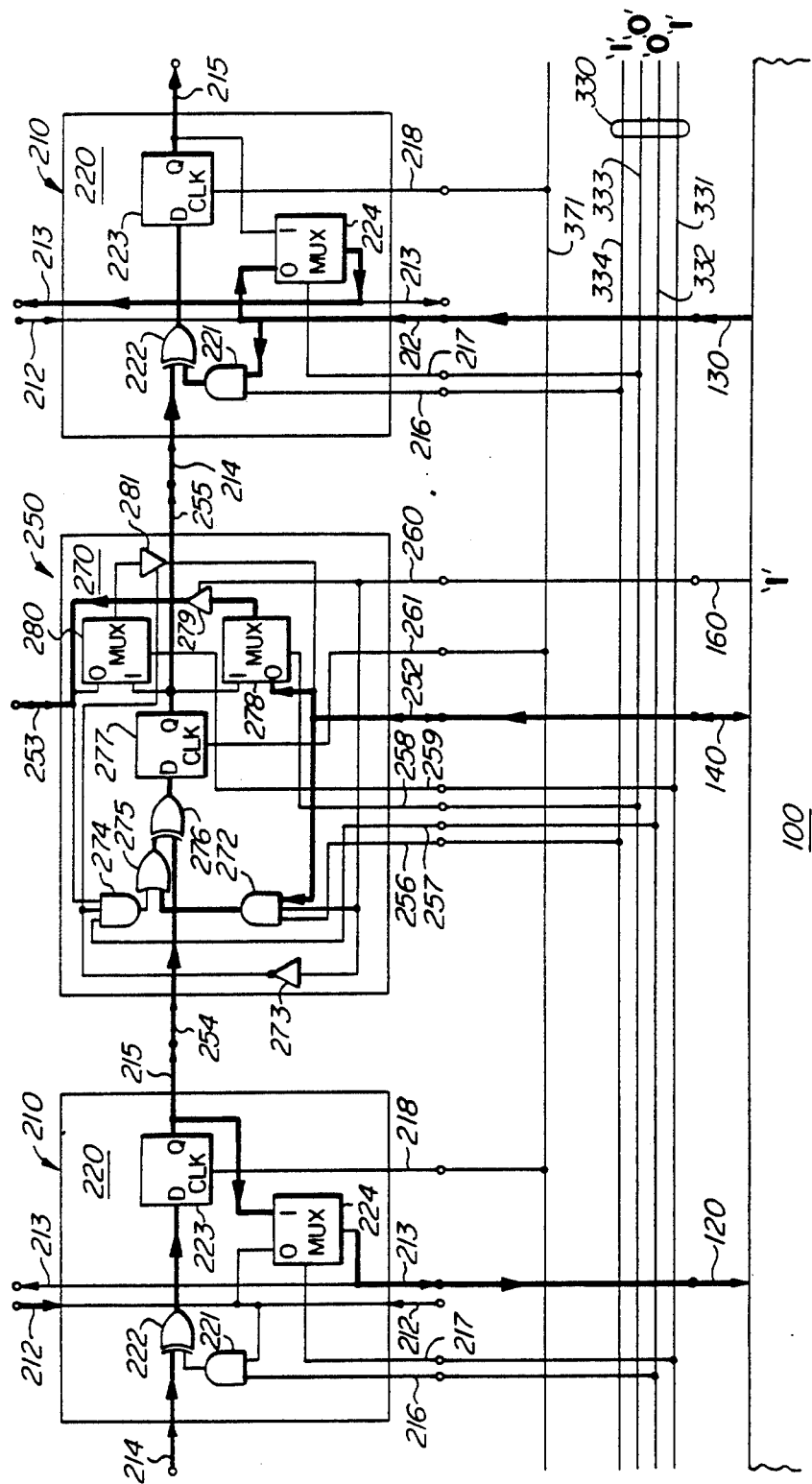
FIG. 8 is a schematic diagram of the boundary register part of FIG. 5 configured for internal mode testing.

FIG. 8 illustrates the signal paths for the internal test mode of the boundary register 200 which is obtained by applying logical zeros to leads 332, 333 and logical ones to leads 331, 334 of the mode control bus 330, and connecting the serial output line 320 to the serial input line 310 at the test access interface to configure the boundary register 200 as a ring register. In the internal test mode, input cells 230 and bidirectional cells operating as input cells (not shown) do not transfer parallel inputs to the corresponding input terminals 120 of the system 100 under test. Instead the input cells 230 transfer serial data to the input terminals 120. Output cells 240 and bidirectional cells operating as output cells (such as cell 250 shown in FIG. 8) transfer the modulo 2 sum of serial input data and parallel data received from output terminals 130 of the system 100 under test to serial output terminals 215, 255. Thus, the boundary register 200 isolates the system 100 under test from external systems 500 while accumulating the outputs in a running checksum which can be compared to a known checksum to determine whether the system 100 under test is functioning properly. Moreover, because the accumulated checksum is transferred to the system 100 under test during subsequent clock cycles, the boundary register 200 acts as a test input generator as well as a test result accumulator in this test mode. The connection of the serial input line 310 to the serial output line 320 provides further feedback for generation purposes.

Figure 9:
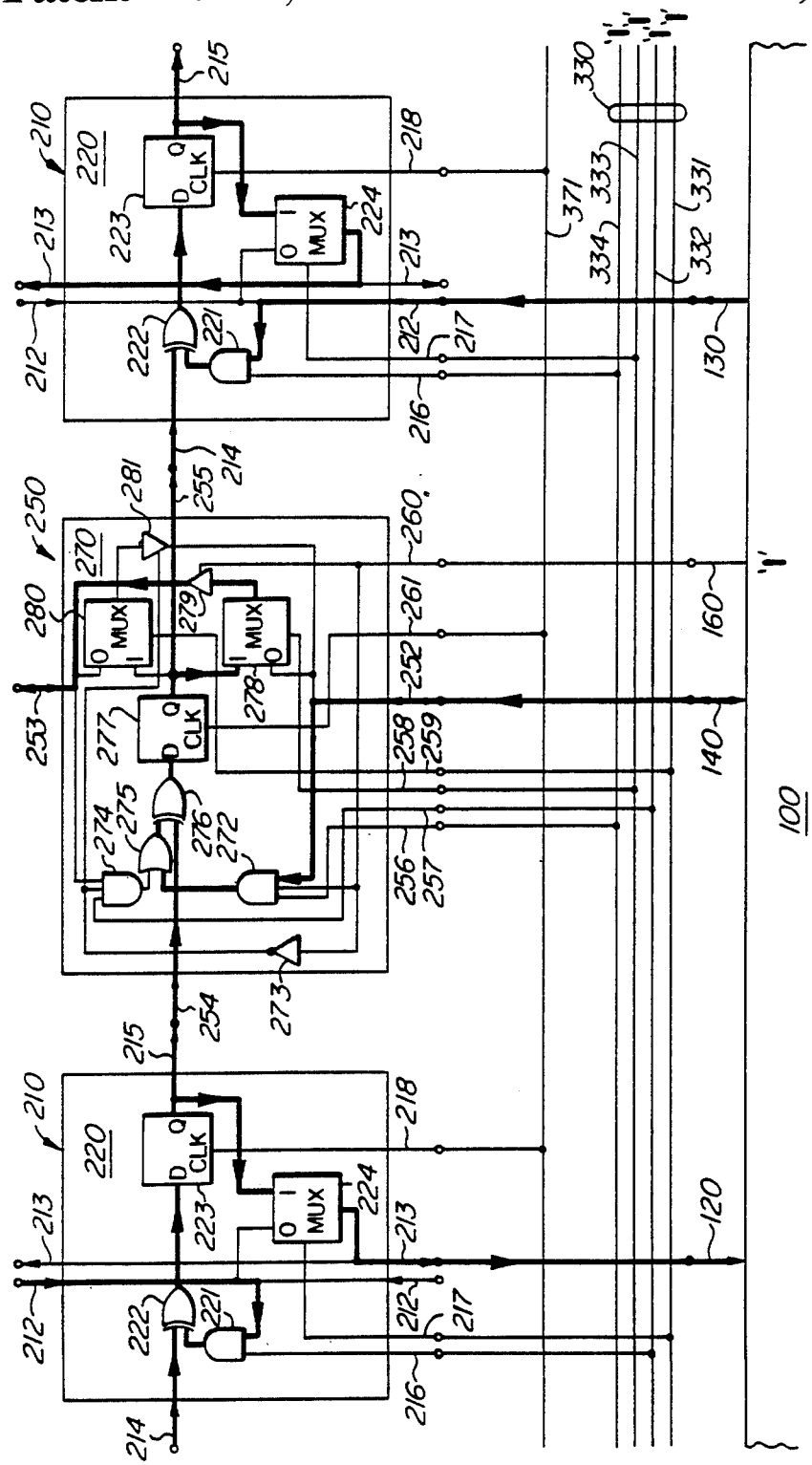
FIG. 9 is a schematic diagram of the boundary register part of FIG. 5 configured for external mode testing.

FIG. 9 illustrates the signal paths for the external test mode of the boundary register 200 obtained by applying logical ones to all leads 331-334 of the mode control bus 330 and connecting the serial output line 320 to the serial input line 310 at the test access interface 300 to configure the boundary register 200 as a ring register. In the external test mode, all cells 230, 240, 250 transfer when clocked the modulo 2 sum of the parallel input data and the serial input data to both the parallel output terminals 213, 253 and the serial output terminals 215, 255. Thus, the boundary register 200 generates inputs to the system 100 under test and outputs to external systems 500 connected to the system 100 via the boundary register while accumulating those inputs and outputs in a running checksum. Because the running checksum depends on the operation of systems external to the system 100 as well as the operation of the system 100, it can be compared with known checksums to simultaneously test the operation of the system 100, external systems 500 connected to the system 100 via the boundary register 200 and interconnections between the system 100 and those external systems 500.

The boundary register 200 may be configured in numerous other test modes by application of other combinations of logical values to leads 331-334 of the mode control bus 330.

The digital system 100 and its associated boundary register 200 may be implemented as a single integrated circuit with the boundary register 200 connected in parallel between input and output terminals of the integrated circuit and corresponding input and output terminals 110 of the system 100. Such an integrated circuit is readily tested by application of appropriate input signals to configure and initialize the boundary register 200, run the boundary register 200 and system 100 through a predetermined number of clock cycles, and read out test result patterns for comparison with known test result patterns. The integrated circuit can be tested in isolation or in situ on a printed circuit board connected to other integrated circuits.

The input signals required for configuring and initializing the boundary register 200 and for reading out test result patterns may be supplied by an external test access interface 300, or the test access interface 300 may be implemented as part of the same integrated circuit.

Figure 10:
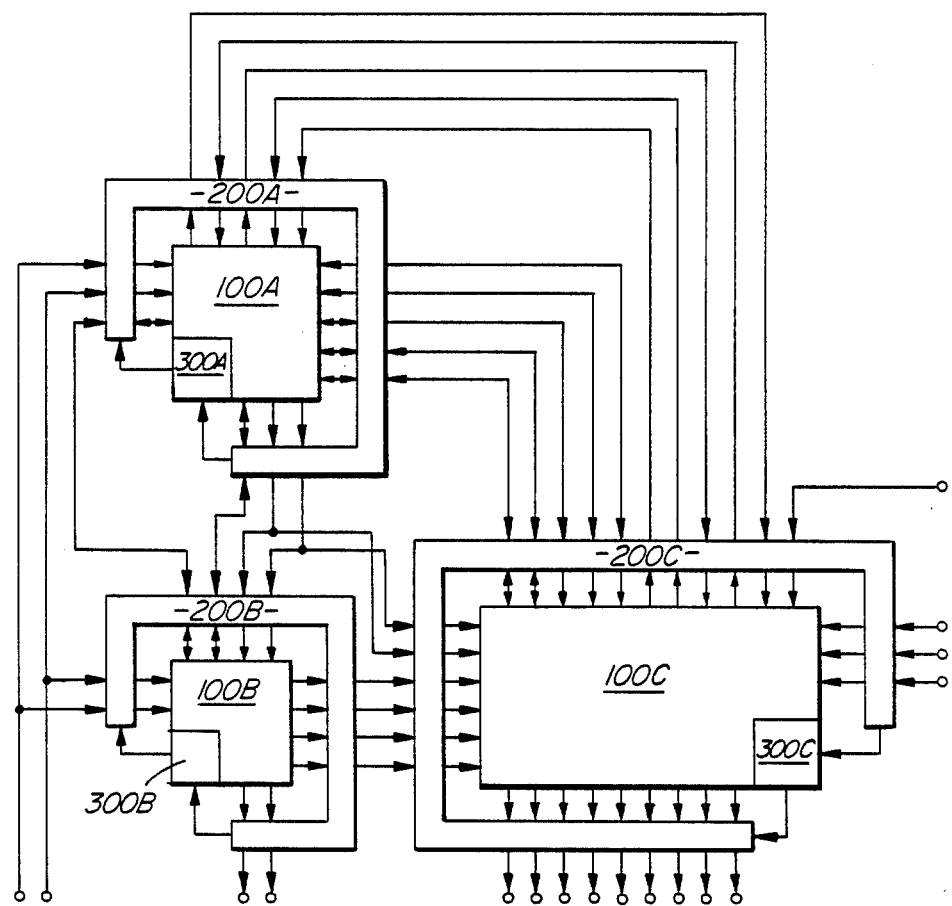
FIG. 10 is a schematic diagram of a digital system incorporating the test apparatus illustrated in FIG. 1.

The digital system 100 may be partitioned into a plurality of subsystems $100_A$, $100_B$, $100_C$, each with an associated boundary register $200_A$, $200_B$, $200_C$. The subsystems $100_A$, $100_B$, $100_C$ are interconnected via the boundary registers $200_A$, $200_B$, $200_C$ as shown in FIG. 10. Each subsystem $100_A$, $100_B$, $100_C$ may also include an associated test access interface $300_A$, $300_B$, $300_C$. Alternatively, a single test access interface may be provided, and the boundary registers $200_A$, $200_B$, $200_C$ may be connected in series to form a single boundary register controlled by the single test access interface.

Numerous modifications of the embodiment described above are within the scope of the invention as claimed below.

For example, where the digital system 100 to be tested has no bidirectional terminals 140, the boundary register 200 may be implemented with only unidirectional cells 210 configured as input cells 230 and output cells 240 as required. Alternatively, a programmable boundary register 200 comprising only bidirectional cells 250 may be supplied as part of external test equipment for connection to a wide variety of systems 100 to be tested. Such a boundary register 200 could be programmed by means of appropriate signals on the direction select terminals 260 of the individual cells 250 to correspond to the particular pattern of input and output terminals 120, 130 for the particular system 100 under test.

Not all of the system terminals 110 need be connected to the boundary register 200 if monitoring of only some of the system inputs and outputs is desired.

The serial input line 310 need not be connected to the serial output line 320 to form a ring register in the various test modes described above. However, if the boundary register 200 is not configured as a ring register, a known signal must be applied to the serial input line 310, and the generation and accumulation characteristics of the boundary register 200 will be altered.

Other implementations of boundary register cells providing similar functionality are possible and will be apparent to those skilled in the design of test systems and circuitry.

Linear feedback paths may be provided between selected cells of the boundary register 200 in certain test modes to modify the generation and accumulation characteristics of the boundary register 200 in those test modes.

The boundary register may be configured for parallel loading rather than serial loading as described above.

We claim:

1. A method for testing a digital system having a plurality of system terminals for coupling input signals into the system and output signals out of the system during normal operation of the system, the method comprising:

connecting at least some of the system terminals in parallel to boundary register means, said boundary register means being operable to pass input signals and output signals transparently through the boundary register means while accumulating together said input signals and said output signals;

initializing the state of the digital system and the state of the boundary register means to predetermined states;

running the digital system and boundary register means through a predetermined number of clock cycles while passing known input signals through the boundary register means into the system and accumulating together within the boundary register means said known input signals and output signals provided by the digital system to generate a test result pattern; and comparing the generated test result pattern to a predetermined test result pattern.

2. A method for testing a digital system having a plurality of system terminals for coupling input signals into the system and output signals out of the system during normal operation of the system, the method comprising:

connecting at least some of the system terminals in parallel to boundary register means, said boundary register means being operable to generate input signals and to pass said input signals from the boundary register means to selected system terminals while receiving output signals from selected system terminals and concurrently accumulating together said input signals and said output signals;

initializing the state of the digital system and the state of the boundary register means to predetermined states;

running the digital system and boundary register means through a predetermined number of clock cycles to generate input signals and to pass said input signals from the boundary register means to selected system terminals while receiving output signals from selected system terminals and accumulating together within the boundary register means said input signals and output signals to generate a test result pattern; and comparing the generated test result pattern to a predetermined test result pattern.

3. A method as defined in claim 2, comprising:

isolating the boundary register means from systems other than the system under test; and accumulating together within the boundary register means initial contents of the boundary register means and output signals from the system under test to generate input signals for application to the system under test and to generate the test result pattern.

4. A method as defined in claim 2, comprising:

connecting selected terminals of the boundary register means to at least one system other than the system under test;

applying signals from the other system to the selected terminals of the boundary register means; and accumulating together the applied signals and output signals from the system under test to generate input signals for application to the system under test and to generate the test result pattern.

5. A method as defined in claim 1 or claim 2, wherein the boundary register means is also operable as a shift register, the method comprising:

configuring the boundary register means as a shift register and shifting a predetermined seed pattern into the boundary register means to intitialize the state of the boundary register means; and configuring the boundary register means as a shift register and shifting the generated test result pattern out of the boundary register means to means for comparing the generated test result pattern with a predetermined test result pattern to compare the generated test result pattern to the predetermined test result pattern.

6. Test apparatus for testing a digital system having a plurality of system terminals for coupling input signals into the system and output signals out of the system during normal operation of the system, the test apparatus comprising:

boundary register means for connection in parallel to at least some of the system terminals, said boundary register means being operable to pass input signals and output signals transparently through the boundary register means while accumulating together said input signals and output signals;

means for initializing the state of the digital system and the state of the boundary register means to predetermined states;

means for running the digital system through a predetermined number of clock cycles while passing known input signals through the boundary register means into the system and accumulating together within the boundary register means said known input signals and output signals provided by the digital system to generate a test result pattern; and means for comparing the generated test result pattern to a predetermined test result pattern.

7. Test apparatus for testing a digital system having a plurality of system terminals for coupling input signals into the system and output signals out of the system during normal operation of the system, the test apparatus comprising:

boundary register means for connection in parallel to at least some of the system terminals, said boundary register means being operable to generate input signals and to pass said input signals from the boundary register means to selected system terminals while receiving output signals from selected system terminals and accumulating together said input signals and said output signals;

means for initializing the state of the digital system and the state of the boundary register means to predetermined states;

means for running the digital system through a predetermined number of clock cycles generate input signals and to pass said input signals from the boundary register means to selected system terminals while receiving output signals from the selected system terminals and accumulating together within the boundary register means said input signals and output signals to generate a test result pattern; and means for comparing the generated test result pattern to a predetermined test result pattern.

8. Test apparatus as defined in claim 7, wherein the boundary register means is operable as a ring register for generating input signals while accumulating together said input signals and output signals received from selected system terminals.

9. Test apparatus as defined in claim 7, wherein the boundary register means is also operable to pass input signals and output signals transparently through the boundary register means.

10. Test apparatus as defined in claim 6 or claim 7, wherein the boundary register means is also operable as a shift register to shift predetermined seed patterns into the boundary register means and to shift generated test result patterns out of the boundary register means.

11. Test apparatus as defined in claim 6 or claim 7, for testing digital systems having a plurality of system input terminals for coupling input signals into the system during normal operation of the system and a plurality of system output terminals for coupling output signals out of the system during normal operation of the system, wherein the boundary register means has:

a plurality of parallel output terminals, each for connection in parallel with a respective one of the system input terminals; and a plurality of parallel input terminals, each for connection in parallel with a respective one of the system output terminals.

12. Test apparatus as defined in claim 6 or claim 7, for testing digital systems having at least one bidirectional system terminal for coupling input signals into the system and output signals out of the system during normal operation of the system, wherein the boundary register means has at least one bidirectional terminal, each bidirectional terminal of the boundary register means for connection in parallel to a respective bidirectional system terminal.

13. A digital integrated circuit, comprising:

a digital system having a plurality of system terminals for coupling input signals into the system and output signals out of the system during normal operation of the system;

a plurality of integrated circuit terminals for coupling input signals into the integrated circuit and output signals out of the integrated circuit; and boundary register means connected in parallel between corresponding integrated circuit terminals and system terminals, said boundary register means being operable to pass input signals and output signals transparently through the boundary register means while accumulating together said input signals and output signals.

14. A digital integrated circuit, comprising:

a digital system having a plurality of system terminals for coupling input signals into the system and output signals out of the system during normal operation of the system;

a plurality of integrated circuit terminals for coupling input signals into the integrated circuit and output signals out of the integrated circuit;

boundary register means connected in parallel between corresponding integrated circuit terminals and system terminals, said boundary register means being operable in a normal operation mode to pass input signals and output signals transparently through the boundary register means and being operable in a test mode to generate input signals and to pass said input signals from the boundary register to selected system terminals while receiving output signals from selected system terminals and accumulating together said input signals and said output signals.

15. An integrated circuit as defined in claim 13 or claim 14 further comprising:
- means for initializing the state of the digital system and the state of the boundary register means to predetermined states;
- means for running the digital system through a predetermined number of clock cycles to generate a test result pattern in the boundary register means; and
- means for comparing the generated test result pattern to a predetermined test result pattern.

16. A digital system, comprising:
- a plurality of digital subsystems, each having a plurality of subsystem terminals for coupling input signals into the subsystem and output signals out of the subsystem during normal operation of the subsystem; and
- a plurality of boundary registers, a respective boundary register connected in parallel to the subsystem terminals of each subsystem, the boundary registers being interconnected to interconnect the subsystems via the boundary registers, each said boundary register being operable to pass input signals and output signals transparently through the boundary register while accumulating together said input signals and output signals.

17. A digital system, comprising:
- a plurality of digital subsystems, each having a plurality of subsystem terminals for coupling input signals into the subsystem and output signals out of the subsystem during normal operation of the subsystem; and
- a plurality of boundary registers, a respective boundary register connected in parallel to the subsystem terminals of each subsystem, the boundary registers being interconnected to interconnect the subsystems, each said boundary register being operable in a normal operation mode to pass input signals and output signals transparently through the boundary register and being operable in a test mode to generate input signals and to pass said input signals from the boundary register to selected subsystem terminals while receiving output signals from selected system terminals and accumulating together said input signals and said output signals.

18. A digital system as defined in claim 16 or claim 17, further comprising:
- means for initializing the state of each digital subsystem and the state of each boundary register to predetermined states;
- means for running the digital subsystems and boundary registers through a predetermined number of clock cycles to generate test result patterns in the boundary registers; and
- means for comparing the generated test result patterns to a predetermined test result patterns.

19. A boundary register cell, comprising:
- a serial input terminal;
- a serial output terminal;
- a parallel input terminal;
- a parallel output terminal;
- control terminal means; and
- signal gating and accumulation means operably connected to the serial input terminal, the serial output terminal, the parallel input terminal, the parallel output terminal and the control terminal means, the signal gating and accumulation means being:
  - responsive to a first predetermined signal on the control terminal means to transfer a serial input bit from the serial input terminal to the serial output terminal;
  - responsive to a second predetermined control signal on the control terminal means to transfer a parallel input bit from the parallel input terminal to the parallel output terminal; and
  - responsive to a third predetermined signal on the control terminal means to transfer a parallel input bit from the parallel input terminal to the parallel output terminal and to transfer a serial output bit to the serial output terminal, the serial output bit comprising the modulo 2 sum of the parallel input bit applied to the parallel input terminal and a serial input bit applied to the serial input terminal, the third predetermined signal being different from the first and second predetermined signals.

20. A boundary register cell as defined in claim 19, wherein the signal gating and accumulation means is responsive to a second predetermined signal on the control terminal means identical to the first predetermined signal to transfer a parallel input bit from the parallel input terminal to the parallel output terminal.

21. A boundary register cell as defined in claim 19, wherein the signal gating and accumulation means is responsive to a fourth predetermined signal on the control terminal means to transfer a serial output bit to the serial output terminal and a parallel output bit to the parallel output terminal, the serial output bit and the parallel output bit each comprising the modulo 2 sum of a serial input bit applied to the serial input terminal and a parallel input bit applied to the parallel input terminal, the fourth predetermined signal being different from the first, second and third predetermined signals.

22. A boundary register cell as defined in claim 19, wherein the signal gating and accumulation means is responsive to a fifth predetermined signal on the control terminal means to transfer a serial input bit from the serial input terminal to the serial output terminal and the parallel output terminal, the fifth predetermined signal being different from the first, second, third and fourth predetermined signals.

23. A boundary register cell as defined in claim 19, wherein:
- the control terminal means comprises:
  - an input select terminal;
  - an output select terminal; and
  - a clock terminal; and
- the signal gating and accumulation means comprises:
  - an AND gate having a first input connected to the input select terminal, a second input connected to the parallel input terminal and an output;
  - an EXCLUSIVE OR gate having a first input connected to the output of the AND gate, a second input connected to the serial input terminal and an output;
  - a flip flop having a data input connected to the output of the EXCLUSIVE OR gate, a clock input connected to the clock terminal and a data output connected to the serial output terminal; and
  - a multiplexer having a first data input connected the data output of the flip flop, a second data input connected to the parallel input terminal, a select input connected to the output select terminal and a data output connected to the parallel output terminal.

24. A boundary register cell, comprising:

a serial input terminal;
a serial output terminal;
a first parallel input/output terminal;
a second parallel input/output terminal;
control terminal means; and
signal gating and accumulation means operably connected to the serial input terminal, the serial output terminal, the first parallel input/output terminal, the second parallel input/output terminal and the control terminal means, the signal gating and compression means being:
  responsive to a first predetermined signal on the control terminal means to transfer a serial input bit from the serial input terminal to the serial output terminal;
  responsive to a second predetermined control signal on the control terminal means to transfer a parallel input bit from the first parallel input/output terminal to the second parallel input/output terminal;
  responsive to a third predetermined signal on the control terminal means to transfer a parallel input bit from the first parallel input/output terminal to the second parallel input/output terminal and to apply a serial output bit to the serial output terminal, the serial output bit comprising the modulo 2 sum of the parallel input bit applied to the first parallel input/output terminal and a serial input bit applied to the serial input terminal, the third predetermined signal being different from the first and second predetermined signals;
  responsive to a fourth predetermined control signal on the control terminal means to transfer a parallel input bit from the second parallel input/output terminal to the first parallel input/output terminal, the fourth predetermined signal being different from the second and third predetermined signals; and
  responsive to a fifth predetermined signal on the control terminal means to transfer a parallel input bit from the second parallel input/output terminal to the first parallel input/output terminal and to transfer a serial output bit to the serial output terminal, the serial output bit comprising the modulo 2 sum of the parallel input bit applied to the second parallel input/output terminal and a serial input bit applied to the serial input terminal, the fifth predetermined signal being different from the first, second, third and fourth predetermined signals.

25. A boundary register cell as defined in claim 24, wherein the signal gating and accumulation means is:
  responsive to a second predetermined signal on the control terminal means identical to the first predetermined signal to transfer a parallel input bit from the parallel input terminal to the parallel output terminal; and
  responsive to the fourth predetermined signal on the control terminal means to transfer a serial input bit from the serial input terminal to the serial output terminal.

26. A boundary register cell as defined in claim 24, wherein the signal gating and accumulation means is:
  responsive to a sixth predetermined signal on the control terminal means to transfer a serial output bit to the serial output terminal and a parallel output bit to the second parallel input/output terminal, the serial output bit and the parallel output bit each comprising the modulo 2 sum of a serial input bit applied to the serial input terminal and a parallel input bit applied to the first parallel input/output terminal, the sixth predetermined signal being different from the first, second, third, fourth and fifth predetermined signals; and
  responsive to a seventh predetermined signal on the control terminal means to transfer a serial output bit to the serial output terminal and a parallel output bit to the first parallel input/output terminal, the serial output bit and the parallel output bit each comprising the modulo 2 sum of a serial input bit applied to the serial input terminal and a parallel input bit applied to the second parallel input/output terminal, the seventh predetermined signal being different from the first, second, third, fourth, fifth and sixth predetermined signals.

27. A boundary register cell as defined in claim 24, wherein the signal gating and accumulation means is:
  responsive to an eighth predetermined signal on the control terminal means to transfer a serial input bit from the serial input terminal to the serial output terminal and the second parallel input/output terminal, the eighth predetermined signal being different from the first, second, third, fourth, fifth, sixth and seventh predetermined signals; and
  responsive to a ninth predetermined signal on the control terminal means to transfer a serial input bit from the serial input terminal to the serial output terminal and the first parallel input/output terminal, the ninth predetermined signal being different from the first, second, third, fourth, fifth, sixth, seventh and eighth predetermined signals.

28. A boundary register cell as defined in claim 24, wherein:
  the control terminal means comprises:
    a first input select terminal;
    a second input select terminal;
    a first output select terminal;
    a second output select terminal;
    a direction select terminal; and
    a clock terminal; and
  the signal gating and accumulation means comprises:
    a first AND gate having a first input connected to the first input select terminal, a second input connected to the first parallel input/output terminal, a third input connected the direction select terminal, and an output;
    an invertor having an input connected to the direction select terminal and an output;
    a second AND gate having a first input connected to the second input select terminal, a second input connected to the second parallel input/output terminal, a third input connected to the output of the invertor and an output;
    an OR gate having a first input connected to the output of the first AND gate, a second input connected to the output of the second AND gate and an output;
    an EXCLUSIVE OR gate having a first input connected to the output of the OR gate, a second input connected to the serial input terminal and an output;
    a flip flop having a data input connected to the output of the EXCLUSIVE OR gate, a clock input connected to the clock terminal and a data output connected to the serial output terminal; and a first multiplexer having a first data input connected to the data output of the flip flop, a second data input connected to the first parallel input/output terminal, a select input connected to the first output select terminal and a data output;

a first tri-state buffer having an enable input connected to the direction select terminal, a data input connected to data output of the first multiplexer and a data output connected to the second parallel input/output terminal;

a second multiplexer having a first data input connected to the data output of the flip flop, a second data input connected to the second parallel input/output terminal, a select input connected to the second output select terminal and a data output;

a second tri-state buffer having an enable input connected to the output of the invertor, a data input connected to data output of the second multiplexer and a data output connected to the first parallel input/output terminal.

29. A boundary register, comprising:

a plurality of boundary register cells as defined in claim 19 or claim 24, said boundary register cells connected in series, serial output terminal to serial input terminal to comprise a chain of cells; and a control bus connected to the control terminal means of each cell.

30. A boundary register as defined in claim 29, further comprising means for connecting ends of the chain of boundary register cells to define a ring register.

* * * * *